(12) United States Patent
Kou et al.

(10) Patent No.: US 10,381,546 B2
(45) Date of Patent: Aug. 13, 2019

(54) BIMORPH-TYPE PIEZOELECTRIC FILM

(71) Applicant: DAIKIN INDUSTRIES, LTD., Osaka (JP)

(72) Inventors: Meiten Kou, Osaka (JP); Tetsuhiro Kodani, Osaka (JP); Tomoyuki Gotou, Osaka (JP); Saori Inaba, Osaka (JP); Takashi Kanemura, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 280 days.

(21) Appl. No.: 15/121,484

(22) PCT Filed: Feb. 26, 2015

(86) PCT No.: PCT/JP2015/055713
§ 371 (c)(1),
(2) Date: Sep. 30, 2016

(87) PCT Pub. No.: WO2015/129829
PCT Pub. Date: Sep. 3, 2015

(65) Prior Publication Data
US 2017/0033276 A1    Feb. 2, 2017

(30) Foreign Application Priority Data
Feb. 26, 2014   (JP) .................. 2014-036083

(51) Int. Cl.
*H01L 41/193*    (2006.01)
*G06F 3/041*    (2006.01)
(Continued)

(52) U.S. Cl.
CPC ............ *H01L 41/193* (2013.01); *G06F 3/041* (2013.01); *G06F 3/0414* (2013.01);
(Continued)

(58) Field of Classification Search
CPC .... H01L 41/193; H01L 41/0926; G06G 3/041
See application file for complete search history.

(56) References Cited

U.S. PATENT DOCUMENTS

2012/0025674 A1* 2/2012 Yoshida ................ C08G 63/08
310/365
2015/0368413 A1* 12/2015 Tatemichi ............... C08K 3/36
359/290

FOREIGN PATENT DOCUMENTS

JP    2006-163619    6/2006
JP    2011-181748    9/2011
(Continued)

OTHER PUBLICATIONS

International Search Report dated Apr. 21, 2015 in International (PCT) Application No. PCT/JP2015/055713.
(Continued)

*Primary Examiner* — J. San Martin
(74) *Attorney, Agent, or Firm* — Wenderoth, Lind & Ponack, L.L.P.

(57) ABSTRACT

An object of the present invention is to provide a bimorph piezoelectric film that enables the production of touch panels and the like that are less influenced by pyroelectric noise due to temperature change, and exhibit high transparency.
The present invention provides a bimorph piezoelectric film comprising in sequence
a first piezoelectric film,
a tackifier layer or an adhesive agent layer, and
a second piezoelectric film,
the first piezoelectric film and the second piezoelectric film being disposed in such a manner that their surfaces on which electric charges of the same polarity are generated by a temperature increase are each outward-facing,
(Continued)

the first piezoelectric film and the second piezoelectric film each having a total light transmittance of 90% or more, and a total haze value of 8.0% or less.

10 Claims, 1 Drawing Sheet

(51) Int. Cl.
*H01L 41/45* (2013.01)
*H01L 41/313* (2013.01)
*H01L 41/113* (2006.01)
*H04R 17/00* (2006.01)

(52) U.S. Cl.
CPC ........ *H01L 41/113* (2013.01); *H01L 41/1132* (2013.01); *H01L 41/1138* (2013.01); *H01L 41/313* (2013.01); *H01L 41/45* (2013.01); *G06F 2203/04103* (2013.01); *H04R 17/005* (2013.01)

(56) References Cited

FOREIGN PATENT DOCUMENTS

| JP | 2011-222679 | | 11/2011 | |
|---|---|---|---|---|
| JP | 2017216450 | A * | 12/2017 | |
| JP | 2017216451 | A * | 12/2017 | |
| WO | WO-9814485 | A1 * | 4/1998 | ............ C08G 59/68 |
| WO | WO-2009119435 | A1 * | 10/2009 | ............ G02B 5/305 |
| WO | WO-2015053346 | A1 * | 4/2015 | ............... G01L 1/16 |
| WO | WO-2017209080 | A1 * | 12/2017 | ............ B32B 27/30 |

OTHER PUBLICATIONS

Polasik et al., "Conductive polymer PEDOT/PSS electrodes on the piezoelectric polymer PVDF", Proceedings of SPIE, vol. 5759, 2005, pp. 114-120.

* cited by examiner

BIMORPH-TYPE PIEZOELECTRIC FILM

TECHNICAL FIELD

The present invention relates to a bimorph piezoelectric film.

BACKGROUND ART

A touch panel including a piezoelectric material has been proposed. When the piezoelectric material is pressed, the material generates a voltage in accordance with a temporal change of distortion occurring at the time the material was pressed. Patent Literature 1 discloses a technique that enables, using the properties, the detection of not only the touch position but also the pressing force (i.e., intensity of pressure) exerted on a touch panel including a piezoelectric material. Additionally, the use of a pyroelectric material as a piezoelectric material can enhance the sensitivity for detection of the pressing force because of its relatively high piezoelectric constant.

Patent Literature 2 discloses, as a piezoelectric film, a polarized vinylidene fluoride/tetrafluoroethylene copolymer film for touch panels or touch pressure detection.

CITATION LIST

Patent Literature

Patent Literature 1: JP2006-163619A
Patent Literature 2: JP2011-222679A

SUMMARY OF INVENTION

Technical Problem

However, in touch panels including a pyroelectric material, a change in temperature of the pyroelectric material produces a pyroelectric effect, which generates a voltage leading to noise output (pyroelectric noise). Thus, alteration in environmental temperature may cause the touch panel to malfunction. Therefore, touch panels with suppressed pyroelectric noise have been desired.

In addition, high transparency of components used in touch panels has been desired.

The present invention was completed to solve the problem, and an object of the invention is to provide a bimorph piezoelectric film that can provide touch panels and the like that are less influenced by pyroelectric noise caused by temperature change, and that exhibit high transparency.

Solution to Problem

The present inventors conducted extensive research, and found that the problem can be solved by a bimorph piezoelectric film comprising in sequence
a first piezoelectric film,
a tackifier layer or an adhesive agent layer, and
a second piezoelectric film,
the first piezoelectric film and the second piezoelectric film being disposed in such a manner that their surfaces on which electric charges of the same polarity are generated by a temperature increase are each outward-facing,
the first piezoelectric film and the second piezoelectric film each having a total light transmittance of 90% or more, and a total haze value of 8.0% or less.

The inventors then completed the invention.
The present invention includes the following embodiments.
Item 1.
A bimorph piezoelectric film comprising in sequence
a first piezoelectric film,
a tacky sheet or an adhesive agent layer, and
a second piezoelectric film,
the first piezoelectric film and the second piezoelectric film being disposed in such a manner that their surfaces on which electric charges of the same polarity are generated by a temperature increase are each outward-facing,
the first piezoelectric film and the second piezoelectric film each having a total light transmittance of 90% or more, and a total haze value of 8.0% or less.
Item 2.
The bimorph piezoelectric film according to Item 1, wherein the tackifier sheet or the adhesive agent layer has a storage modulus of 0.1 MPa or more, an inner haze value of 0.6% or less, and a thickness of 30 μm or less.
Item 3.
The bimorph piezoelectric film according to Item 1 or 2, wherein the first piezoelectric film and the second piezoelectric film are each a polarized vinylidene fluoride/tetrafluoroethylene copolymer piezoelectric film, and each have a total light transmittance of 92% or more, an inner haze value of 0.6% or less, and a thickness of 40 μm or less, and wherein the tackifier layer or the adhesive agent layer has a thickness of 15 μm or less.
Item 4.
An input device comprising the bimorph piezoelectric film according to any one of Items 1 to 3.
Item 5.
A speaker comprising the bimorph piezoelectric film according to any one of Items 1 to 3.
Item 6.
An electronic device comprising the input device according to Item 4 or the speaker according to Item 5.

Advantageous Effects of Invention

The bimorph piezoelectric film according to the present invention is less influenced by pyroelectric noise caused by temperature change, and can provide, for example, a touch panel with high transparency.

DESCRIPTION OF EMBODIMENTS

Meaning of Terms

As used herein, "detection" of a "touch position" means determination of a touch position; and "detection" of "touch pressure" means determination of the presence or absence, speed, or degree (intensity) of pressing, or changes thereof, or combinations thereof.

As used herein, the term "touch" encompasses touching, being touched, pressing, being pressed, and contacting.

As used herein, the term "polarized" means that electric charges are placed on the surface. Therefore, the polarized film can be an electret.

Bimorph Piezoelectric Film

The bimorph piezoelectric film of the present invention comprises in sequence a first piezoelectric film, a tacky sheet or an adhesive agent layer, and a second piezoelectric film, the first piezoelectric film and the second piezoelectric film being disposed in such a manner that by a temperature increase, electric charges of the same polarity are generated on each outward-facing film surface, the first piezoelectric film and the second piezoelectric film each having a total light transmittance of 90% or more, and a total haze value of 8.0% or less.

The bimorph piezoelectric film of the present invention is a laminate.

The first and second piezoelectric films included in the bimorph piezoelectric film of the present invention are each a single-layer piezoelectric film. As used herein, the phrase "single-layer piezoelectric film" means that the film is not a laminate obtained by adhering the first and second piezoelectric films via a tacky sheet or adhesive agent layer, and the phrase is used with an intention to distinguish the first and second piezoelectric films from the bimorph piezoelectric film.

The first piezoelectric film used in the bimorph piezoelectric film of the present invention is preferably an organic piezoelectric film. The "organic piezoelectric film" is formed of a polymer, which is an organic substance (polymer film). Examples of the "organic piezoelectric film" include polarized vinylidene fluoride-based polymer films, odd-chain nylon piezoelectric films, and polylactic acid. The "organic piezoelectric film" may optionally contain one or more components other than the polymer. The "organic piezoelectric film" encompasses films formed of the polymer, and films formed of the polymer containing inorganic substance(s) dispersed therein.

The content of the polymer in the piezoelectric film of the present invention is preferably 80 mass % or more, more preferably 85 mass % or more, and even more preferably 90 mass %. The upper limit of the content is not particularly limited, and may be, for example, 100 mass %, or 99 mass %.

The polymer is preferably a vinylidene fluoride-based polymer.

The piezoelectric film of the present invention preferably consists of a polarized vinylidene fluoride-based polymer film.

In this specification, examples of "vinylidene fluoride-based polymer film" include vinylidene fluoride/tetrafluoroethylene copolymer films, vinylidene fluoride/trifluoroethylene copolymer films, and polyvinylidene fluoride films.

The vinylidene fluoride-based polymer film is preferably a vinylidene fluoride/tetrafluoroethylene copolymer film.

The "vinylidene fluoride-based polymer film" may contain additive(s) typically used in resin films.

The "vinylidene fluoride-based polymer film" is formed of a vinylidene fluoride-based polymer, and contains a vinylidene fluoride-based polymer.

Examples of "vinylidene fluoride-based polymer" include:

(1) copolymers of vinylidene fluoride with one or more monomers copolymerizable with vinylidene fluoride; and (2) polyvinylidene fluoride.

Examples of the "monomers copolymerizable with vinylidene fluoride" in "(1) copolymers of vinylidene fluoride with one or more monomers copolymerizable with vinylidene fluoride" include trifluoroethylene, tetrafluoroethylene, hexafluoropropylene, chlorotrifluoroethylene, and vinyl fluoride.

The "one or more monomers copolymerizable with vinylidene fluoride" or one of the monomers is preferably tetrafluoroethylene.

Preferable examples of "vinylidene fluoride-based polymer" include vinylidene fluoride/tetrafluoroethylene copolymers.

The "vinylidene fluoride/tetrafluoroethylene copolymer" may contain repeating units derived from monomer(s) other than vinylidene fluoride and tetrafluoroethylene, as long as the properties concerning the present invention are not greatly impaired.

The "(1) copolymers of vinylidene fluoride with one or more monomers copolymerizable with vinylidene fluoride" contain repeating units derived from vinylidene fluoride in an amount of 50 mol % or more (preferably 60 mol % or more).

In the "vinylidene fluoride/tetrafluoroethylene copolymer," the molar ratio (repeating units derived from tetrafluoroethylene)/(repeating units derived from vinylidene fluoride) is within the range of preferably 5/95 to 36/64, more preferably 15/85 to 25/75, and even more preferably 18/82 to 22/78.

The "vinylidene fluoride/tetrafluoroethylene copolymer" may contain repeating units derived from monomer(s) other than vinylidene fluoride and tetrafluoroethylene, as long as the properties concerning the present invention are not greatly impaired. Typically, the content of such repeating units is 10 mol % or less. Such monomer(s) are not limited as long as the monomer(s) are copolymerizable with a vinylidene fluoride monomer and a tetrafluoroethylene monomer. Examples of the monomers include:

(1) fluoro monomers (e.g., vinyl fluoride (VF), trifluoroethylene (TrFE), hexafluoropropene (HFP), 1-chloro-1-fluoro-ethylene (1,1-CFE), 1-chloro-2-fluoro-ethylene (1,2-CFE), 1-chloro-2,2-difluoroethylene (CDFE), chlorotrifluoroethylene (CTFE), trifluorovinyl monomer, 1,1,2-trifluorobutene-4-bromo-1-butene, 1,1,2-trifluorobutene-4-silane-1-butene, perfluoroalkyl vinyl ether, perfluoromethyl vinyl ether (PMVE), perfluoropropyl vinyl ether (PPVE), perfluoroacrylate, 2,2,2-trifluoroethyl acrylate, and 2-(perfluorohexyl)ethyl acrylate); and (2) hydrocarbon-based monomers (e.g., ethylene, propylene, maleic anhydride, vinyl ether, vinyl ester, allyl glycidyl ether, acrylic acid-based monomers, methacrylic acid-based monomers, and vinyl acetate).

The first piezoelectric film has a total light transmittance of preferably 91% or more, and more preferably 93% or more. The upper limit of the total light transmittance is not limited, and the first piezoelectric film typically has a total light transmittance of 99% or less.

In this specification, "total light transmittance" is determined by a light transmission test based on ASTM D1003 using an NDH7000SP CU2II (trade name) (Nippon Denshoku Industries Co., Ltd.) haze meter or a similar instrument.

The first piezoelectric film has a total haze value of preferably 6.0% or less, more preferably 4.0% or less, even more preferably 3.0% or less, and even still more preferably 1.5% or less. The total haze value is preferably as low as possible. Although the lower limit is not limited, the first piezoelectric film typically has a total haze value of 0.1% or more.

In this specification, "total haze value" (total haze) is determined by a haze test (HAZE, turbidity) based on ASTM D1003 using a Haze Guard II (trade name) (Toyo Seiki Seisaku-Sho, Ltd.) or a similar instrument.

The first piezoelectric film has an inner haze value of preferably 6.0% or less, more preferably 4.0% or less, even more preferably 3.0% or less, even still more preferably 2.0% or less, particularly preferably 1.5% or less, particularly more preferably 1.0% or less, particularly even more preferably 0.8% or less, particularly even still more preferably 0.6% or less, and most preferably 0.4% or less. The inner haze value is preferably as low as possible. Although the lower limit is not limited, the first piezoelectric film typically has an inner haze value of 0.1% or more.

In this specification, "inner haze value" (inner haze) is determined, in the method for measuring the total haze value, by pouring water into a glass cell, inserting the film into the cell, and measuring the haze value.

The first piezoelectric film has an outer haze value of preferably 3.0% or less, more preferably 1.5% or less, and even more preferably 1.0% or less. The outer haze value is preferably as low as possible. Although the lower limit is not limited, the piezoelectric film of the present invention typically has an outer haze value of 0.1% or more.

In this specification, "outer haze value" (outer haze) is calculated by deducting the inner haze value from the total haze value of the film.

The first piezoelectric film has a piezoelectric coefficient (d33) within the range of preferably 40 to 0.1 pC/N, more preferably 30 to 1 pC/N, and even more preferably 20 to 2 pC/N.

In this specification, the piezoelectric coefficient (d33) of the single-layer piezoelectric film is measured using a d33 meter (PM300, Piezotest Ltd.), or a similar instrument.

The first piezoelectric film has an electromechanical coupling coefficient within the range of typically 0.1 to 0.01, preferably 0.09 to 0.02, and more preferably 0.08 to 0.03.

The change rate of the electromechanical coupling coefficient of the first piezoelectric film must be 10% or less, preferably 8% or less, and more preferably 6% or less.

In this specification, the electromechanical coupling coefficient may be sometimes denoted as kt.

The "electromechanical coupling coefficient" (kt) of the piezoelectric film is determined by forming an Al-deposited electrode on each surface of the piezoelectric film, cutting out a disc of 13 mm in a predetermined area of the piezoelectric film, measuring the disc using an impedance analyzer (Hewlett-Packard Company, 4194A) or a similar instrument, and calculating the electromechanical coupling coefficient in accordance with a procedure described in "The application of ferroelectric polymer, Ultrasonic transducers in the megahertz range" by H. Ohigashi et al.

In this specification, the "change rate of the electromechanical coupling coefficient" refers to a change rate of the electromechanical coupling coefficient observed when the film has been heated at 85° C. for 10 hours, unless particularly indicated otherwise.

The "change rate of the electromechanical coupling coefficient" is determined by
(1) measuring the electromechanical coupling coefficient of the piezoelectric film (kt before heating);
(2) heating the piezoelectric film in the air at 85° C. for 10 hours;
(3) allowing the piezoelectric film to stand at room temperature to thereby cool the film to room temperature; and
(4) measuring the electromechanical coupling coefficient of the heated and cooled piezoelectric film (kt after heating), and applying the measured "kt before heating" and "kt after heating" to the following equation:

(($kt$ after heating−$kt$ before heating)/$kt$ before heating)×100 change rate of electromechanical coupling coefficient (%)=|amount of change in electromechanical coupling coefficient (%)|

In this specification, "room temperature" refers to a temperature within the range of 15 to 35° C.

The first piezoelectric film has a thickness of preferably 40 μm or less. The first piezoelectric film has a thickness within the range of, for example, 0.5 to 100 μm, 0.8 to 50 μm, 0.8 to 40 μm, 3 to 100 μm, 3 to 50 μm, 3 to 40 μm, 3 to 30 μm, 3 to 25 μm, or 5 to 20 μm.

It is preferable that the first piezoelectric film is formed of a polarized vinylidene fluoride-based polymer film;
the film has a yellow index (YI) value of 4 or less, which is measured in accordance with JIS K 7105; and
the film has an L* of 85 or more, a* of 0.5 or more, and b* of 1.5 or less in Ca*b* color space measured in accordance with JIS K 7105.

Because of the YI value and L*, a*, and b* within the numerical ranges, the film exhibits suppressed color, and can serve as a piezoelectric film with high visibility for display devices when used in a touch panel, and the like.

The yellow index (YI) value measured in accordance with JIS K 7105 of the first piezoelectric film is preferably 4 or less, and more preferably 3 or less. The lower limit of the YI value is not particularly limited, and is typically about 0.1.

The YI value of the piezoelectric film can be measured by a method according to JIS K 7105, using an SZ Sigma 90 analyzer (Nippon Denshoku Industries Co., Ltd.) with a C/2 light source at room temperature and normal humidity.

The L* in L*a*b* color space measured in accordance with JIS K 7105 of the first piezoelectric film is preferably 85 or more, and more preferably 90 or more. The upper limit of L* is not particularly limited, and is typically about 99.

The a* in L*a*b* color space measured in accordance with JIS K 7105 of the first piezoelectric film is preferably 0.5 or less, and more preferably 0.1 or less. The lower limit of a* is not particularly limited, and is typically about 0.01.

The b* in L*a*b* color space measured in accordance with JIS K 7105 of the first piezoelectric film is preferably 1.5 or less, and more preferably 1.3 or less. The lower limit of b* is not particularly limited, and is typically about 0.8.

The L*, a*, and b* of the piezoelectric film can be measured by a method according to JIS K 7105, using an SZ Sigma 90 analyzer (Nippon Denshoku Industries Co., Ltd.) with a C/2 light source at room temperature and normal humidity.

The first piezoelectric film preferably has a retardation of 1 to 20 nm. When the retardation falls within this range, the color of the piezoelectric film can be further suppressed.

The retardation of the first piezoelectric film can be measured by irradiating the film with light of 550 nm using an RETS4200RV (Otsuka Electronics Co., Ltd.).

The first piezoelectric film is preferably produced by using a polymer that meets at least one condition selected from the following conditions (1) to (3), and more preferably produced by using a polymer that meets all of the following conditions (1) to (3):

(1) the content of a surfactant is 100 ppm or less;
(2) the content of methylcellulose is 6,000 ppm or less; and
(3) the total content of metal and ion is 200 ppm or less.

When the first piezoelectric film is formed as described above, the YI value of the first piezoelectric film can be 4 or less, and L* in L*a*b* color space can be 85 or more, with a* being 0.5 or more and b* being 1.5 or less.

Regarding condition (1), a surfactant may be contained in the first piezoelectric film when the polymer used in the production of the film is produced by emulsion polymerization, and the polymer contains a residual surfactant.

The content of the surfactant is preferably 100 ppm or less. The content of the surfactant is preferably 50 ppm or less. The lower limit of the content of the surfactant is not particularly limited. When the polymer is produced by suspension polymerization, the lower limit of the content of the surfactant is typically 0 ppm.

The content of the surfactant in the first film can be detected by suspending the polymer in water, treating the suspension with ultrasound for 10 minutes or more, and measuring the water containing extracted surfactant, using a DX500 analyzer (Dionex Corporation).

Regarding condition (2), methylcellulose may be contained in the first piezoelectric film when the polymer used in the production of the film is produced by suspension polymerization, and the polymer contains residual methylcellulose.

The content of the methylcellulose is preferably 6,000 ppm or less. The content of the methylcellulose is more preferably 5,000 ppm or less. The lower limit of the content of methylcellulose is not particularly limited. When the polymer is produced by emulsion polymerization, the lower limit of the content of the methylcellulose is typically 0 ppm. When the polymer is produced by suspension polymerization, the lower limit of the content of the methylcellulose is typically about 3,000 ppm or less.

The content of methylcellulose in the piezoelectric film can be detected by suspending the polymer in water, treating the suspension with ultrasound for 10 minutes or more, and measuring the water containing extracted methylcellulose, by using a DX500 analyzer (Dionex Corporation).

Regarding condition (3), metal and ion may be contained in a polymer produced by either emulsion polymerization or suspension polymerization; when the first piezoelectric film is produced by such polymers, metal and ion may be contained in the film.

The total content of metal and ion is preferably 200 ppm or less. The total content of metal and ion is more preferably 100 ppm or less. The lower limit of the total content of metal and ion is not particularly limited. When the polymer is produced by emulsion polymerization, the lower limit of the total content of metal and ion is typically about 30 ppm. When the polymer is produced by suspension polymerization, the lower limit of the total content of metal and ion is typically about 10 ppm.

The metal is not particularly limited, and examples thereof include Fe and Cr.

The ion is not particularly limited, and examples thereof include $SO_4^{2-}$ and $Cl^-$.

The content of metal in the piezoelectric film can be detected by burning the piezoelectric film, extracting the metal with a 0.1 wt % diluted hydrochloric acid, and measuring the extract using an SPS3000 analyzer (Seiko Instruments Inc.).

The content of ion in the first piezoelectric film can be measured by cutting the piezoelectric film into pieces as small as powder, immersing the pieces in water to treat them with ultrasound for 1 hour or more, and analyzing the water containing ion extract using a DX500 analyzer (Dionex Corporation).

Method for Producing First and Second Piezoelectric Films

The first and second piezoelectric films can be produced, for example, by a production method comprising step A of subjecting a non-polarized polymer film (e.g., a non-polarized vinylidene fluoride-based polymer film) to a polarization treatment; and step B of subjecting the polarized polymer film (e.g., a polarized vinylidene fluoride-based polymer film) to a heat-treatment.

Step A: Polarization Treatment Step

In step A, a non-polarized polymer film is subjected to a polarization treatment.

The "non-polarized polymer film" used in step A can be produced, for example, by a known method, such as casting, hot press, or melt extrusion. The "non-polarized polymer film" used in step A is preferably a film produced by casting.

The method for producing a "non-polarized polymer film" by casting is, for example, a production method comprising:

(1) dissolving or dispersing a polymer (e.g., a vinylidene fluoride-based polymer) optionally with desired component(s) (e.g., inorganic oxide particles and a compatibility improver) in a solvent to prepare a liquid composition;

(2) casting (applying) the liquid composition on a substrate; and (3) evaporating the solvent to thereby form a film.

The dissolution temperature in the preparation of the liquid composition is not particularly limited. However, a high dissolution temperature is preferable because it facilitates the dissolution. However, an excessively high dissolution temperature is likely to impart a color to the resulting film, and thus the dissolution temperature is preferably room temperature or more, and 80° C. or less.

Preferable examples of the solvent, from the standpoint of coloring prevention, include ketone solvents (e.g., methyl ethyl ketone (MEK), methyl isobutyl ketone (MIBK), acetone, diethyl ketone, and dipropyl ketone), ester solvents (e.g., ethyl acetate, methyl acetate, propyl acetate, butyl acetate, and ethyl lactate), ether solvents (e.g., tetrahydrofuran, methyltetrahydrofuran, and dioxane), and amide solvents (e.g., dimethylformamide (DMF), and dimethylacetamide). These solvents may be used singly, or in a combination of two or more. As the solvent, an amide solvent, which is widely used in the dissolution of polyvinylidene fluoride (PVDF), may be used; however, the amount of the amide solvent contained in the solvent is preferably 50% or less.

The liquid composition may be cast (applied) onto a substrate according to a commonly used method, such as knife coating, cast coating, roll coating, gravure coating, blade coating, rod coating, air doctor coating, or slot die. Of these, gravure coating or slot die is preferable from the standpoint of easy handling, less irregular thickness of the resulting film, and excellent productivity. Examples of usable substrates include polyethylene terephthalate (PET) films.

The solvent can be evaporated by a commonly used drying method, such as heating.

The drying temperature for the evaporation of the solvent may be suitably determined according to the type of solvent or the like, and is typically within the range of 20° C. to 200° C., and preferably 40° C. to 170° C.

The drying temperature may be constant or changed. Changing the drying temperature from a low temperature (e.g., 40 to 100° C.) to a high temperature (e.g., 120 to 200°

C.) can decrease the haze value of the resulting film. This can be achieved by, for example, dividing a drying zone into several zones, and allowing the film (or the solution cast before film formation) to enter the low-temperature zone and move to the higher-temperature zones.

More specifically, for example, the drying zone may be divided into four zones each having a temperature of 50° C., 80° C., 120° C., or 150° C., and the film may be conveyed continuously from the 50° C. zone through the 150° C. zone.

The drying time for evaporating the solvent is typically within the range of 1 to 600 seconds, and preferably 10 to 200 seconds.

The "non-polarized vinylidene fluoride-based polymer film" (hereinafter, may be simply referred to as "non-polarized film") used in step A is preferably an unstretched film. In this production method as well, the non-polarized film is preferably not stretched. That is, the first and second piezoelectric films are preferably unstretched piezoelectric films.

The first and second piezoelectric films thus obtained have high thickness uniformity. More specifically, the first and second piezoelectric films preferably have a variation coefficient of thickness of ±20% or less with respect to the average film thickness, when the variation coefficient of thickness is measured at 10 points in every one-centimeter square of the entire film.

The non-polarized film used in step A may be a film that has been heat-treated after film formation.

The thickness of the non-polarized film used in step A can be determined depending on the piezoelectric film to obtain.

The polarization treatment in step A can be performed by a commonly used method, such as corona discharge treatment.

The polarization treatment in step A is preferably performed by corona discharge.

Although either negative corona or positive corona may be used for corona discharge, negative corona is preferably used because of the ease of polarization of non-polarized resin films.

The corona discharge treatment is not particularly limited. The treatment can be performed, for example, by applying voltage to a non-polarized film using linear electrodes as described in JP2011-181748A (Patent Literature 2); or by applying voltage to a non-polarized film using needle-shaped electrodes.

The conditions for the corona discharge treatment may be suitably set based on common knowledge in the art to which the present invention pertains. If the conditions for the corona discharge treatment are overly weak, the obtained piezoelectric film may have insufficient piezoelectricity. On the other hand, if the conditions for the corona discharge treatment are overly strict, the obtained piezoelectric film may have point-like defects.

For example, when voltage is continuously applied using linear electrodes by a roll-to-roll process, the direct current electric field is, for example, −15 to −25 kV; however, this varies depending on the distance between the linear electrodes and the non-polarized film, the film thickness, and the like. The rate of treatment is, for example, 10 to 500 cm/min.

Alternatively, the polarization treatment may be performed, for example, by applying voltage to the non-polarized film with the film sandwiched between plate electrodes. More specifically, when voltage is applied to the non-polarized film with the film sandwiched between plate electrodes, the following conditions, for example, may be applied: a direct current electric field of 0 to 400 MV/m (preferably 50 to 400 MV/m), and a voltage application time of 0.1 seconds to 60 minutes.

Step B: Heat Treatment Step

Step B is performed after step A. In step B, the polarized vinylidene fluoride-based polymer film (which hereinafter may be simply referred to as the polarized film) obtained in the polarization treatment in step A is heat-treated.

The heat treatment in step B can be performed on the polarized film or a part in which polarization has been completed in step A. More specifically, while the polarization treatment in step A is performed, the heat treatment in step B may also be performed on the part in which the polarization treatment has been completed.

The method for the heat treatment is not particularly limited, and may be performed, for example, by sandwiching the polarized film between two metal plates and heating the metal plates; heating a roll of the polarized film in a constant-temperature chamber; heating a metal roller and bringing the polarized film into contact with the heated metal roller in the production of the film by a roll-to-roll process; or passing the polarized film through a heated oven by a roll-to-roll process. When the heat treatment is performed, the polarized film may be heat-treated singly, or the film may be stacked on another type of film or a metal foil to form a laminated film and the laminated film may be heat-treated. In particular, when the heat treatment is performed at high temperatures, the latter method is preferable because wrinkles are less likely to be formed in the polarized film.

The temperature for the heat treatment may vary depending on the type of polarized film to be heat-treated, and is preferably within the range of the melting point of the polarized film to be heat-treated−100° C. to the melting point of the polarized film to be heat-treated+40° C.

More specifically, the temperature for the heat treatment is preferably 80° C. or more, more preferably 85° C. or more, and even more preferably 90° C. or more.

The temperature for the heat treatment is also preferably 170° C. or less, more preferably 160° C. or less, and even more preferably 140° C. or less.

The time for the heat treatment is typically 10 seconds or more, preferably 0.5 minutes or more, more preferably 1 minute or more, and even more preferably 2 minutes or more.

The upper limit of the time for the heat treatment is not limited, and the time for the heat treatment is typically 60 minutes or less.

The conditions for the heat treatment are preferably such that the temperature of the heat treatment is 90° C. or more, and the time for the heat treatment is 1 minute or more.

In this specification, the melting point of the film means a maximal value on the heat-of-fusion curve obtained when the temperature is raised at a rate of 10° C./min, using a device for differential scanning calorimetry (DSC).

After the heat treatment, the polarized polymer film is cooled to a predetermined temperature. The temperature is preferably within the range of 0° C. to 60° C., and may be room temperature. The cooling rate may be gradual or rapid, and rapid cooling is preferable from the standpoint of productivity. Rapid cooling can be performed, for example, by means such as blown air.

In the bimorph piezoelectric film of the present invention, the first and second piezoelectric films are bonded to each other through a tacky sheet or adhesive agent layer.

The tacky sheet is not particularly limited, as long as the first and second piezoelectric films can be bonded to each other. The tacky sheet may be formed of a single or two or more layers. More specifically, when the tacky sheet is formed of a single layer, the tacky sheet is formed of a tackifier layer; when the tacky sheet is formed of two or more layers, both outer layers are tackifier layers. When the tacky sheet is formed of three or more layers, the tacky sheet may include a substrate layer as an inner layer.

It is sufficient that the substrate layer for the tacky sheet is a transparent film, and preferable examples of the substrate include films formed of polyimide, polyethylene terephthalate, polybutylene terephthalate, polycarbonate, poly(para-phenylene sulfide), or polyamide imide.

The tackifier layer of the tacky sheet may contain an acrylic-based tackifier as a tackifier.

The adhesive forming the adhesive agent layer may be an acrylic-based adhesive.

The tackifier layer or adhesive agent layer used in the bimorph piezoelectric film of the present invention is preferably, for example, a tackifier layer formed of a polymer containing at least one type of acrylic-based monomer having the ester group (—COO—) as a constituent unit. Examples of the acrylic-based monomer having the ester group (—COO—) include alkyl(meth)acrylate represented by formula $CH_2=CR^1—COOR^2$ wherein $R^1$ represents hydrogen or methyl, and $R^2$ represents alkyl having 1 to 14 carbon atoms; and (meth)acrylate, such as hydroxy-containing (meth)acrylate.

Specific examples of the alkyl(meth)acrylate represented by formula $CH_2=CR^1—COOR^2$ wherein $R^1$ represents hydrogen or methyl, and $R^2$ represents alkyl having 1 to 14 carbon atoms include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-pentyl (meth)acrylate, isopentyl (meth)acrylate, n-hexyl (meth)acrylate, 2-ethylhexyl (meth)acrylate, n-octyl (meth)acrylate, isooctyl (meth)acrylate, isononyl (meth)acrylate, decyl (meth)acrylate, and dodecyl (meth)acrylate. These can be used singly, or in a combination of two or more. Of these, 2-ethylhexyl (meth)acrylate and n-butyl (meth)acrylate are preferably used.

From the standpoint of adhesive power, the number of carbon atoms of alkyl represented by $R^2$ of alkyl(meth)acrylate is 1 to 14. Alkyl having 15 or more carbon atoms is not preferable because the adhesive power may be lowered. The alkyl represented by $R^2$ preferably has 1 to 12 carbon atoms, preferably 4 to 12 carbon atoms, and more preferably 4 to 8 carbon atoms.

Of alkyl(meth)acrylates wherein alkyl represented by $R^2$ has 1 to 14 carbon atoms, alkyl(meth)acrylates wherein alkyl represented by $R^2$ has 1 to 3 or 13 to 14 carbon atoms may be used as part of the monomer. However, it is preferable to use, as an essential component, alkyl(meth)acrylate wherein alkyl represented by $R^2$ has 4 to 12 carbon atoms (e.g., 50 to 100 mol %).

The alkyl represented by $R^2$ may be a linear or branched-chain alkyl.

The tackifier layer or adhesive agent layer used in the bimorph piezoelectric film of the present invention is also preferably formed of, for example, a polymer containing at least one type of hydroxy-containing (meth)acrylate as a constituent unit. Examples of hydroxy-containing (meth)acrylate include 2-hydroxyethyl (meth)acrylate, 2-hydroxypropyl (meth)acrylate, 4-hydroxybutyl (meth)acrylate, polyethylene glycol mono(meth)acrylate, polypropylene glycol mono(meth)acrylate, and cyclohexane dimethanol mono (meth)acrylate. The tackifier layer or adhesive agent layer may also be a pressure-sensitive tacky layer that contains neither carboxylic acid nor hydroxyl groups. Because carboxylic acid may cause whitening, a tackifier layer or adhesive agent layer containing no carboxylic acid is preferable.

From the standpoint of storage modulus enhancement, the tackifier layer or adhesive agent layer used in the bimorph piezoelectric film of the present invention is also preferably formed of, for example, the polymer described above into which crosslinkable sites are introduced. Examples of crosslinkable sites include a thermal crosslinking site, a chemical crosslinking site, and an ultraviolet crosslinking site. Thermal crosslinking or ultraviolet crosslinking is preferable. As an ultraviolet crosslinkable site, the following moiety is adoptable: when excited by ultraviolet irradiation, the moiety can pull out a hydrogen radical from other portions inside (meth)acrylic copolymer molecules or other (meth)acrylic copolymer molecules. Examples of such moieties include benzophenone moiety, benzyl moiety, o-benzoylbenzoic acid ester moiety, thioxanthone moiety, 3-keto coumarin moiety, 2-ethylanthraquinone moiety, and camphorquinone moiety.

The tackifier layer or adhesive agent layer may contain additive(s) that can typically be contained in tackifier compositions or adhesive compositions that form the tackifier layer or adhesive agent layer, as long as the effect of the present invention is not greatly impaired.

The tacky sheet or adhesive agent layer used in the present invention has a storage modulus of preferably 0.08 MPa or more, more preferably 0.1 MPa or more, even more preferably 0.12 MPa or more. The upper limit of the storage modulus of the tacky sheet or the adhesive agent layer used in the present invention is not particularly limited. The storage modulus of the tacky sheet or the adhesive agent layer used in the present invention is typically 0.9 MPa or less.

The tacky sheet or adhesive agent layer used in the present invention has an inner haze of preferably 0.6% or less, more preferably 0.5% or less, and even more preferably 0.4% or less. The lower limit of inner haze of the tacky sheet or the adhesive agent layer used in the present invention is not particularly limited. The inner haze of the tacky sheet or the adhesive agent layer used in the present invention is typically 0.01% or more.

The tacky sheet or adhesive agent layer used in the present invention has a thickness of preferably 30 μm or less, and more preferably 15 μm or less. The tacky sheet or adhesive agent layer used in the present invention has a thickness of preferably 0.1 μm or more, and more preferably 1 μm or more.

In a preferable embodiment of the present invention, the tacky sheet or adhesive agent layer has a storage modulus of 0.1 MPa or more, and a thickness of 15 μm or less.

Examples of the second piezoelectric film used in the bimorph piezoelectric film of the present invention are as described above for the first piezoelectric film.

Preferable examples of the second piezoelectric film used in the bimorph piezoelectric film of the present invention are as described above for the first piezoelectric film.

The second piezoelectric film used in the bimorph piezoelectric film of the present invention may be the same as or different from the first piezoelectric film.

The second piezoelectric film preferably has a piezoelectric coefficient (d33) that approximates to that of the first piezoelectric film. Specifically, the ratio of the piezoelectric coefficient (d33) of the second piezoelectric film to the piezoelectric coefficient (d33) of the first piezoelectric film is within the range of preferably 0.6 to 1.4, and more preferably 0.8 to 1.2.

In a preferable embodiment of the present invention, the first and second piezoelectric films are polarized vinylidene fluoride/tetrafluoroethylene copolymer piezoelectric films, and have a total transmittance of 92% or more, an inner haze value of 0.6% or less, and a thickness of 40 µm or less. The first and second piezoelectric films may differ in film thickness. When the thickness is different, the thinner of the first and second piezoelectric films is preferably disposed on the outer side of the film that is distorted by touching or the like.

In a preferable embodiment of the present invention, the first and second piezoelectric films are polarized vinylidene fluoride/tetrafluoroethylene copolymer piezoelectric films, and have a total transmittance of 92% or more, an inner haze value of 0.6% or less, and a thickness of 40 µm or less, while the tacky sheet or the adhesive agent layer has a storage modulus of 0.1 MPa or more and a thickness of 15 µm or less.

The bimorph piezoelectric film of the present invention can be produced by a commonly used method for producing bimorph piezoelectric films.

The bimorph piezoelectric film of the present invention can be produced, for example, by adhering a tacky sheet onto the first piezoelectric film, and then adhering the second piezoelectric film onto the tacky sheet so that by a temperature increase, electric charges of the same polarity are generated on each outward-facing film surface. When a tacky sheet is adhered to a film on which a tackifier has been applied, both may be in the form of a sheet, or the sheet and film may be adhered continuously using a roll-to-roll technique. A pressure is applied for adhering the sheet and film preferably to the degree that the piezoelectric film does not deform. For adhering, heating may be applied.

The bimorph piezoelectric film of the present invention can also be produced, for example, by applying an adhesive composition onto the surface of the first piezoelectric film, and then placing the second piezoelectric film thereon so that electric charges of the same polarity are generated on each outward-facing film surface by a temperature increase.

The bimorph piezoelectric film of the present invention has a total light transmittance of 90% or more, preferably 91% or more, and more preferably 92% or more. The upper limit of the total light transmittance of the bimorph piezoelectric film of the present invention is not limited. The total light transmittance of the bimorph piezoelectric film of the present invention is typically 99% or less.

The bimorph piezoelectric film of the present invention has a total haze value of 8.0% or less, preferably 6.0% or less, and more preferably 4.0% or less. The upper limit of the total haze value of the bimorph piezoelectric film of the present invention is not limited. The total haze value of the bimorph piezoelectric film of the present invention is typically 0.2% or more.

The bimorph piezoelectric film of the present invention has a thickness within the range of preferably 5 to 300 µm, more preferably 10 to 120 µm, and even more preferably 15 to 90 µm.

The bimorph piezoelectric film of the present invention has a piezoelectricity within the range of preferably 30 to 1,500 mV, more preferably 50 to 1,200 mV, and even more preferably 100 to 1,000 mV, as measured by the method described later with a load of 300 g.

The piezoelectricity of the bimorph piezoelectric film of the present invention is measured by the following method.

Preparation of Sample of Bimorph Piezoelectric Film

The piezoelectricity is measured as described below by preparing a sample of a suitable size (e.g., length 65 mm× width 35 mm) onto which ITO (indium tin oxide) has been adhered as transparent electrodes.

Two ITO electrodes (length 65 mm× width 35 mm× thickness 50 µm) were provided. One electrode was placed on the top surface of a single-layer piezoelectric film or a bimorph piezoelectric film (length 65 mm× width 35 mm), with another on the bottom surface, using 10 µm-thick transparent tacky layers (Nichiei Kakoh Co., Ltd., MHM-FED10).

Measurement of Piezoelectricity of Bimorph Piezoelectric Film

The piezoelectricity of the bimorph piezoelectric film is measured by the following method.

A glass plate (length 125 mm×width 60 mm×thickness 0.54 mm) was placed on an acrylic resin frame so that both ends (15 mm wide) of the plate in the longitudinal direction were in contact with the frame.

The sample (the ITO-adhered bimorph piezoelectric film of length 65 mm×width 35 mm) is adhered to the bottom surface of the glass plate through a 10 µm-thick transparent tacky layer (Nichiei Kakoh Co., Ltd., MHM-FED10).

Figure 2:
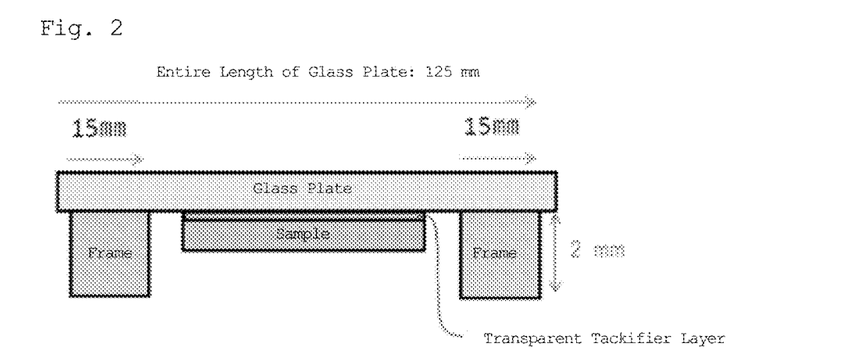
FIG. 2 is an explanatory diagram illustrating the setup for the method for measuring piezoelectricity and pyroelectricity.

FIG. 2 shows a general layout of this embodiment.

A load of a predetermined weight is placed on the central part, and the generated piezoelectric signal is measured.

Figure 3:
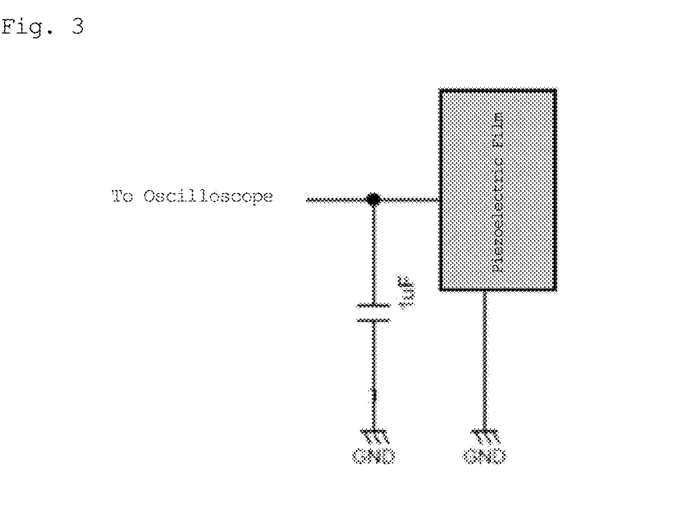
FIG. 3 is an explanatory diagram illustrating the method for measuring piezoelectricity and pyroelectricity.

The generated piezoelectric signal is measured using the configuration shown in FIG. 3.

The voltage is measured using a UDS 5204S (JDS Inc.) as an oscilloscope in an integrator circuit.

Measurement of Pyroelectricity of Bimorph Piezoelectric Film

A thermocouple is attached to the central part of the sample in the same setup used in piezoelectricity measurement.

The thermocouple detects a change in temperature, and the same device used for measuring the piezoelectric signal measures the pyroelectric signal to read the voltage.

Hot air is applied to the sample with a dryer to increase the temperature from 20° C. to 40° C. for 0.5 to 1 minute, and the generated voltage is measured.

The bimorph piezoelectric film of the present invention has a pyroelectricity of preferably 100 mV or less, more preferably 60 mV or less, and even more preferably 50 mV or less. The lower limit of the pyroelectricity of the bimorph piezoelectric film of the present invention is not particularly limited. The pyroelectricity of the bimorph piezoelectric film of the present invention is typically 1 mV or more.

The ratio of piezoelectricity to pyroelectricity of the bimorph piezoelectric film of the present invention (in this specification, it may be referred to as an S/N ratio) is preferably 3 or more, more preferably 4 or more, even more preferably 5 or more, even still more preferably 10 or more, particularly preferably 20 or more, particularly more preferably 30 or more, and most preferably 50 or more. The upper limit of the S/N ratio is not particularly limited. The S/N ratio is typically 100 or less.

Figure 1:
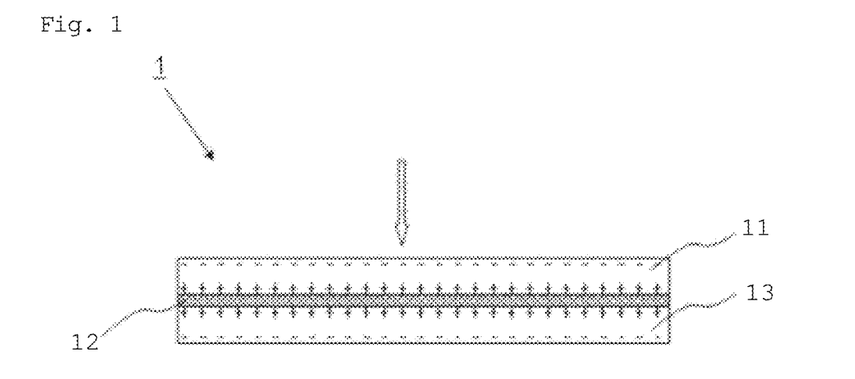
FIG. 1 is a cross-sectional view illustrating one embodiment of the bimorph piezoelectric film of the present invention.

FIG. 1 shows an embodiment of the bimorph piezoelectric film of the present invention.

A bimorph piezoelectric film 1 comprising in sequence
a first piezoelectric film 11,
a tackifier layer or an adhesive agent layer 12, and
a second piezoelectric film 13,
    the first piezoelectric film 11 and the second piezoelectric film 13 being disposed in such a manner that by a temperature increase, electric charges of the same polarity (negative (−) charges) are generated on each outward-facing film surface.

When temperature change occurs in the bimorph piezoelectric film 1 of the present invention, the temperature of the first piezoelectric film 11 and the temperature of the second piezoelectric film 13 increase in the same manner, and then electric charges of the same polarity are generated on the outer surface of both films. This means that in the measurement of the difference in electrical potential between the top surface of the first piezoelectric film 11 and the bottom surface of the second piezoelectric film 13, the electrical signals generated by pyroelectricity are reduced, thereby making it possible to selectively detect electrical signals generated by piezoelectricity.

When temperature change occurs in the bimorph piezoelectric film 1 of the present invention, the temperature of the first piezoelectric film 11 and the temperature of the second piezoelectric film 13 increase in the same manner. However, for example, when a pressing force is applied in the direction of the open arrow shown in FIG. 1, the first piezoelectric film 11 and the second piezoelectric film 13 do not deform in the same manner. Thus, in the measurement of the difference in electrical potential between the top surface of the first piezoelectric film 11 and the bottom surface of the second piezoelectric film 13, the electrical signals generated by pyroelectricity are reduced, thereby making it possible to selectively detect electrical signals generated by piezoelectricity.

Applications

Piezoelectric Panel

The bimorph piezoelectric film of the present invention can be used for piezoelectric panels (e.g., touch panels, preferably touch panels capable of detecting touch pressure) and the like.

A touch panel comprising the bimorph piezoelectric film of the present invention can detect both touch positions and touch pressure; the panel exhibits suppressed pyroelectric noise, and its transparency is high.

The bimorph piezoelectric film of the present invention can be used for any type of touch panel, such as resistive-type and capacitive-type touch panels.

In the use of the bimorph piezoelectric film of the present invention in touch panels, it is not necessary to use the film for detecting both touch positions and touch pressure. The bimorph piezoelectric film of the present invention may be used for detecting either touch positions or touch pressure.

A piezoelectric panel comprising the bimorph piezoelectric film of the present invention comprises the bimorph piezoelectric film of the present invention and electrodes. The piezoelectric panel preferably comprises in sequence:

a first electrode (preferably a transparent electrode);

the bimorph piezoelectric film of the present invention; and a second electrode (preferably a transparent electrode).

The first electrode is directly or indirectly disposed on one principal surface of the bimorph piezoelectric film of the present invention, and the second electrode is directly or indirectly disposed on the other principal surface of the bimorph piezoelectric film of the present invention.

When a piezoelectric panel comprising the bimorph piezoelectric film of the present invention (e.g., a touch panel, preferably a touch panel capable of detecting touch pressure) is pressed with a finger or the like, an electrical signal in response to the temporal change in distortion of the film of the present invention can be detected; therefore, use of the piezoelectric panel makes it possible to determine the presence or absence, speed, or degree (intensity) of pressing, or changes thereof, or combinations thereof. The degree of pressing (i.e., static pressure) can be determined using an integral value of the electrical signal.

The first and second piezoelectric films used in the bimorph piezoelectric film of the present invention can exhibit pyroelectricity. However, in the bimorph piezoelectric film of the present invention, the first and second piezoelectric films are disposed in such a manner that by a temperature increase, electric charges of the same polarity (e.g., positive charges and positive charges, or negative charges and negative charges) are generated on each outward-facing film surface. Thus, in the piezoelectric panel (e.g., a touch panel, preferably a touch panel capable of detecting touch pressure), when a potential difference between the two principal surfaces of the bimorph piezoelectric film of the present invention is detected as an electrical signal by the first electrode and the second electrode, the electric signal generated by pyroelectricity is reduced, thereby making it possible to selectively obtain the electric signal generated by piezoelectricity.

A touch panel comprising the bimorph piezoelectric film of the present invention can be used for input devices and touch sensor devices. In an input device comprising the touch panel (i.e., an input device comprising the bimorph piezoelectric film of the present invention), input based on touch positions, touch pressure, or both (e.g., input based on the degree (intensity) of pressing, such as writing pressure) is possible. An input device and a touch sensor device both comprising the touch panel can have a position detector and a pressure detector.

The input device can be used for electronic devices (e.g., cellular phones, such as smartphones, personal digital assistants (PDAs), tablet PCs, ATMs, automatic ticket vending machines, digitizers, touchpads, car navigation systems, and touch panel displays (touch panel monitors) of FA (factory automation) devices. An electronic device comprising the input device allows for operations and actions based on touch positions, touch pressure, or both (e.g., operations, such as changing the thickness of lines displayed on a screen according to writing pressure in painting software).

The touch sensor device can be used for electronic devices (e.g., collision sensors and robotic vacuum cleaners).

The electronic devices may comprise the touch input device of the present invention or the touch sensor device of the present invention, or may consist of the touch input device of the present invention or the touch sensor device of the present invention.

Because of its ability to be deformed by electrical signals and then vibrate the air, the bimorph piezoelectric film of the present invention can be used in a speaker. The speaker can be used in, for example, electronic devices described for the input device. In particular, because the bimorph piezoelectric film of the present invention is transparent, a transparent speaker can be produced by using the film. The transparent speaker can be provided to a display screen of, for example, cellular phones (e.g., smartphones), personal digital assistances (PDA), and tablet PCs.

EXAMPLES

The following Examples describe the present invention in more detail. However, the present invention is not limited to these Examples.

Example 1

Preparation of Piezoelectric Film
Preparation of Non-Polarized Film

A vinylidene fluoride/tetrafluoroethylene copolymer (TFE/VDF=20/80) was dissolved in methyl ethyl ketone (MEK), thereby preparing a coating composition with a solids content of 24 wt %.

The obtained coating composition was filtered through a depth-pleated filter with a pore diameter of 3 μm, and the filtered coating composition was cast on PET films using a die coater, followed by drying, thereby preparing polymer films of different thickness (thickness: 30 μm, 20 μm, 15 μm, and 10 μm).

The drying step was conducted as follows: the drying apparatus was divided into four zones with 2 m space for each zone, and the temperature was set for each zone to 50° C., 80° C., 120° C., and 150° C. from the entry side; and the passing speed for each zone was set at 8 rotations/min. The films (or the cast coating composition) were then allowed to pass through each zone. The dried polymer films were peeled off from the PET films.

Polarization Treatment

The polymer films were each sandwiched by metal electrodes from above and below, and a direct voltage was applied to the polymer films (thickness: 30 μm, 20 μm, 15 μm, and 10 μm) at 300 kV/cm at room temperature for 5 minutes for polarization, thereby obtaining polarized films.

Heat Treatment

Thereafter, the polarized films were heated at 90° C. for 5 minutes in a hot-air dryer, and then allowed to stand at room temperature to cool to room temperature, thereby obtaining single-layer piezoelectric films.

The obtained single-layer piezoelectric films were measured for the total light transmittance, haze value (total haze value and inner haze value), piezoelectricity (d33), and pyroelectricity in accordance with the methods. Table 1 shows the results.

Total Light Transmittance

The total light transmittance was measured by a light transmission test in accordance with ASTM D1003 using an NDH7000SP CU2II (trade name, Nippon Denshoku Industries Co., Ltd.) haze meter.

Haze Value: Outer Haze Value and Inner Haze Value

The total haze value was measured by a light transmission test in accordance with ASTM D1003 using an NDH7000SP CU2II (trade name, Nippon Denshoku Industries Co., Ltd.) haze meter.

The inner haze value was determined by placing water in a glass cell, inserting each film in the cell, and measuring the haze value in accordance with the measurement method for the total haze value.

Measurement of Piezoelectricity (Piezoelectric Coefficient (d33)) of Single-Layer Piezoelectric Film The piezoelectricity (piezoelectric coefficient (d33)) of the single-layer piezoelectric films was measured using a d33 meter (PM300 Piezotest Ltd.).

Results of Measurement of Single-Layer Piezoelectric Films

TABLE 1

| Thickness | Total Light Transmittance (%) | Total Haze (%) | Inner Haze (%) | d33 (pC/N) |
|---|---|---|---|---|
| 30 μm | 94 | 0.8 | 0.3 | 10.2 |
| 20 μm | 94 | 0.7 | 0.3 | 10.1 |
| 15 μm | 95 | 0.6 | 0.2 | 9.7 |
| 10 μm | 95 | 0.5 | 0.2 | 9.6 |

Preparation of Bimorph Piezoelectric Film

A tackifier layer was adhered to the positively (+) charged surface of one single-layer piezoelectric film that had been cut to A4 size, and another single-layer piezoelectric film was adhered to the tackifier layer so that the positively (+) charged surface of the latter film comes into contact with the tackifier layer, thereby preparing a bimorph piezoelectric film.

Preparation of Tackifier Layer

The tackifier layer (with no substrate) was prepared by selecting acrylic-based tackifiers having the following physical properties.

A1: film thickness 5 μm, inner haze 0.3%, storage modulus 0.2 MPa

A2: film thickness 10 μm, inner haze 0.4%, storage modulus 0.2 MPa

A3: film thickness 25 μm, inner haze 0.5%, storage modulus 0.2 MPa

A4: film thickness 40 μm, inner haze 0.6%, storage modulus 0.2 MPa

A4 acrylic-based tackifier was used for Comparative Examples.

B1: film thickness 25 μm, inner haze 0.4%, storage modulus 0.05 MPa

B2: film thickness 25 μm, inner haze 0.4%, storage modulus 0.09 MPa

B3: film thickness 25 μm, inner haze 0.4%, storage modulus 0.65 MPa

B3 acrylic-based tackifier was used for Comparative Examples.

The optical properties (total light transmittance and haze value (total haze value and inner haze value)) of the obtained bimorph piezoelectric films were measured in the same manner as for single-layer piezoelectric films.

The piezoelectricity and pyroelectricity were measured by the following methods.

Table 2 shows the results for the first and second piezoelectric films with a thickness of 30 μm.

Table 3 shows the results for the first and second piezoelectric films with a thickness of 20 μm, 15 μm, and 10 μm.

Measurement of Piezoelectricity and Pyroelectricity of Bimorph Piezoelectric Film The piezoelectricity and pyroelectricity tests for bimorph piezoelectric films were conducted with samples prepared by pasting ITO (indium tin oxide) as transparent electrodes onto the films.

Two ITO electrodes (length 65 mm×width 35 mm× thickness 50 μm) were used. One electrode was placed on the top surface of the bimorph piezoelectric film (length 65 mm×width 35 mm), with another on the bottom surface, through 10 μm-thick transparent tacky layers (Nichiei Kakoh Co., Ltd., MHM-FED10).

A glass plate (length 125 mm×width 60 mm×thickness 0.54 mm) was placed on an acrylic resin frame with both ends (15 mm wide) of the plate in the longitudinal direction being in contact with the frame.

A sample (the ITO pasted bimorph piezoelectric film of length 65 mm×width 35 mm) was adhered to the bottom surface of the glass plate through a 10 mm-thick transparent tacky layer (Nichiei Kakoh Co., Ltd., MHM-FED10).

FIG. 2 shows a general layout of this embodiment.

A load of a predetermined weight was placed on the central part, and the generated piezoelectric signal was measured.

The generated piezoelectric signal was measured using the configuration shown in FIG. 3.

The voltage was measured using a UDS 5204S (JDS Inc.) as an oscilloscope in an integrator circuit.

Pyroelectricity

A thermocouple was attached to the central part of the sample in the same setup used in piezoelectricity measurement.

The thermocouple detected a change in temperature. For the piezoelectric signal, the voltage was measured using the same device used for the pyroelectric signal.

Hot air was applied to the sample with a dryer to increase the temperature from 20° C. to 40° C. over the time period of 0.5 to 1 minute, and the generated voltage was measured.

TABLE 2

| Combination (Thickness of Piezoelectric Film/Tackifier Layer) | Total Light Transmittance (%) | Total Haze (%) | Piezoelectricity (mV) | Pyroelectricity (mV) | S/N Ratio |
|---|---|---|---|---|---|
| 30 μm/A1 | 94 | 1.8 | 380 | 5 | 76.0 |
| 30 μm/A2 | 94 | 1.9 | 350 | 10 | 35.0 |
| 30 μm/A3 | 93 | 2.0 | 220 | 40 | 5.5 |
| 30 μm/A4 (Comparative Example) | 92 | 3.2 | 120 | 90 | 1.3 |
| 30 μm/B1 (Comparative Example) | 94 | 1.8 | 90 | 40 | 2.3 |
| 30 μm/B2 | 94 | 1.8 | 170 | 40 | 4.3 |
| 30 μm/B3 | 94 | 1.8 | 450 | 40 | 11.3 |

The results reveal that when the tacky layer was thick, the canceling of pyroelectricity was insufficient, and piezoelectric signals were lowered, resulting in an S/N ratio below 3 and an insufficient ratio of piezoelectricity to pyroelectricity; thus, the resultant was not suitable for use. The optical properties were also unsatisfactory.

When the storage modulus was below 0.08 MPa, the piezoelectric signals were weak, thereby resulting in an insufficient S/N ratio.

TABLE 3

| Combination (Thickness of Piezoelectric Film/Tackifier Layer) | Total Light Transmittance (%) | Total Haze (%) | Piezoelectricity (mV) | Pyroelectricity (mV) | S/N Ratio |
|---|---|---|---|---|---|
| 20 μm/A2 | 94 | 1.7 | 340 | 10 | 34.0 |
| 15 μm/A2 | 94 | 1.4 | 350 | 10 | 35.0 |
| 10 μm/A3 | 95 | 1.0 | 320 | 10 | 32.0 |

As the film thickness was thinner, the optical properties were likely to improve. However, the S/N ratio did not change.

The thickness of the first and second piezoelectric films (i.e., the front piezoelectric film, which is on the bottom side of the sample shown in FIG. 2, and the rear piezoelectric film, which is on the upper side of the sample shown in FIG. 2) was changed, and the total light transmittance, total haze, piezoelectricity, and pyroelectricity were measured in the same manner. Table 4 shows the results.

TABLE 4

| Combination (Thickness of Front Piezoelectric Film/Tackifier Layer/Thickness of Rear Piezoelectric Film) | Total Light Transmittance (%) | Total Haze (%) | Piezoelectricity (mV) | Pyroelectricity (mV) | S/N Ratio |
|---|---|---|---|---|---|
| 30 μm/A2/20 μm | 94 | 1.7 | 340 | 10 | 34.0 |
| 30 μm/A2/10 μm | 94 | 1.4 | 390 | 20 | 19.5 |
| 10 μm/A2/30 μm | 94 | 1.4 | 280 | 20 | 14.0 |

The results reveal that when the thickness of the film was changed between the front and the rear piezoelectric films, optical properties were improved in the cases where the total thickness of both films was smaller. The results also reveal that when the rear piezoelectric film had a smaller thickness, the piezoelectric signal was intensified.

INDUSTRIAL APPLICABILITY

The bimorph piezoelectric film of the present invention can be used, for example, in piezoelectric panels, such as touch panels capable of detecting touch pressure.

The invention claimed is:

1. A bimorph piezoelectric film comprising in sequence a first piezoelectric film,
a tacky sheet or an adhesive agent layer, and
a second piezoelectric film,
    the first piezoelectric film and the second piezoelectric film being disposed in such a manner that their surfaces on which electric charges of the same polarity are generated by a temperature increase are each outward-facing,
    the first piezoelectric film and the second piezoelectric film each having a total light transmittance of 90% or more, and a total haze value of 8.0% or less,
wherein the tacky sheet or the adhesive agent layer has a storage modulus of 0.1 MPa or more, an inner haze value of 0.6% or less, and a thickness of 30 μm or less.

2. The bimorph piezoelectric film according to claim 1, wherein the first piezoelectric film and the second piezoelectric film are each a polarized vinylidene fluoride/tetrafluoroethylene copolymer piezoelectric film, and each have a total light transmittance of 92% or more, an inner haze value of 0.6% or less, and a thickness of 40 μm or less, and
wherein the tacky sheet or the adhesive agent layer has a thickness of 15 μm or less.

3. A piezoelectric panel comprising the bimorph piezoelectric film according to claim 1.

4. An input device comprising the bimorph piezoelectric film according to claim 1.

5. A speaker comprising the bimorph piezoelectric film according to claim 1.

6. An electronic device comprising the input device according to claim 4.

7. A piezoelectric panel comprising the bimorph piezoelectric film according to claim 2.

8. An input device comprising the bimorph piezoelectric film according to claim 2.

9. A speaker comprising the bimorph piezoelectric film according to claim 2.

10. An electronic device comprising the speaker according to claim 5.

* * * * *